(12) United States Patent
Falck et al.

(10) Patent No.: US 10,943,974 B2
(45) Date of Patent: Mar. 9, 2021

(54) METHOD FOR PRODUCING A SEMICONDUCTOR COMPONENT HAVING A CHANNEL STOPPER REGION

(71) Applicant: Infineon Technologies AG, Neubiberg (DE)

(72) Inventors: Elmar Falck, Hohenbrunn (DE); Franz-Josef Niedernostheide, Hagen a. T.W. (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/227,854

(22) Filed: Dec. 20, 2018

(65) Prior Publication Data

US 2019/0198610 A1 Jun. 27, 2019

(30) Foreign Application Priority Data

Dec. 21, 2017 (DE) .......................... 10 2017 130 928

(51) Int. Cl.
*H01L 29/06* (2006.01)
*H01L 21/225* (2006.01)
(Continued)

(52) U.S. Cl.
CPC ...... *H01L 29/0638* (2013.01); *H01L 21/2253* (2013.01); *H01L 21/266* (2013.01);
(Continued)

(58) Field of Classification Search
CPC ............. H01L 29/0638; H01L 29/0619; H01L 29/66333; H01L 29/66712; H01L 29/7395;
(Continued)

(56) References Cited

U.S. PATENT DOCUMENTS 4,861,729 A 8/1989 Fuse et al.
7,629,665 B2 * 12/2009 Barthelmess ....... H01L 29/0638
257/197
(Continued)

FOREIGN PATENT DOCUMENTS

DE 19741167 A1 4/1999
DE 102005031908 B3 10/2006
(Continued)

OTHER PUBLICATIONS

Lutz, Josef, "Der beidseitig sperrfähige IGBT", Halbleiter-Leistungsbauelemente: Physik, Eigenschaften, Zuverlässigkeit, Springer Science & Business Media, Jun. 22, 2006, pp. 266-267.

*Primary Examiner* — Timor Karimy
(74) *Attorney, Agent, or Firm* — Murphy, Bilak & Homiller, PLLC

(57) ABSTRACT

A channel stopper region extending from a first main surface into a component layer of a first conductivity type is formed in an edge region of a component region, the edge region being adjacent to a sawing track region. Afterward, a doped region extending from the first main surface into the component layer is formed in the component region. The channel stopper region is formed by a photolithographic method that is carried out before a first photolithographic method for introducing dopants into a section of the component region outside the channel stopper region.

22 Claims, 11 Drawing Sheets

(51) Int. Cl.
*H01L 21/78* (2006.01)
*H01L 21/265* (2006.01)
*H01L 21/266* (2006.01)
*H01L 21/02* (2006.01)
*H01L 29/66* (2006.01)
*H01L 29/739* (2006.01)
*H01L 29/78* (2006.01)

(52) U.S. Cl.
CPC ........ *H01L 21/26513* (2013.01); *H01L 21/78* (2013.01); *H01L 29/0619* (2013.01); *H01L 21/02238* (2013.01); *H01L 21/02255* (2013.01); *H01L 29/66333* (2013.01); *H01L 29/66712* (2013.01); *H01L 29/7395* (2013.01); *H01L 29/7811* (2013.01)

(58) Field of Classification Search
CPC ............. H01L 29/7811; H01L 21/2253; H01L 21/26513; H01L 21/266; H01L 21/78; H01L 21/02238; H01L 21/02255
See application file for complete search history.

(56) References Cited

U.S. PATENT DOCUMENTS

| | | | |
|---|---|---|---|
| 8,975,721 B2* | 3/2015 | Schmidt | H01L 29/74 257/499 |
| 2004/0261839 A1* | 12/2004 | Gee | H01L 21/76898 136/256 |
| 2013/0320462 A1* | 12/2013 | Tipirneni | H01L 21/266 257/409 |
| 2015/0115449 A1* | 4/2015 | Schaffer | H01L 21/76846 257/751 |
| 2016/0293691 A1* | 10/2016 | Falck | H01L 29/0623 |
| 2017/0323958 A1 | 11/2017 | Kuruc et al. | |

FOREIGN PATENT DOCUMENTS

| | | |
|---|---|---|
| DE | 102005023668 B3 | 11/2006 |
| DE | 102006023598 B3 | 11/2007 |
| DE | 102005004355 B4 | 12/2008 |
| DE | 102006011697 B4 | 1/2012 |
| DE | 102012209429 A1 | 12/2012 |
| DE | 102015110112 A1 | 12/2015 |
| DE | 102015105016 A1 | 10/2016 |
| DE | 102015212464 A1 | 1/2017 |

* cited by examiner

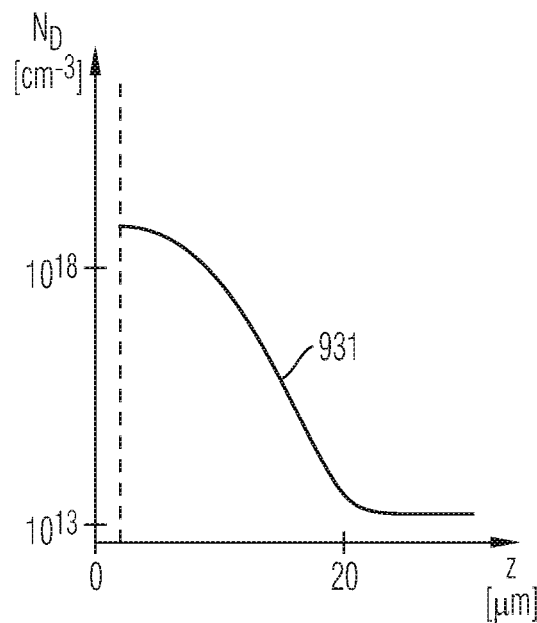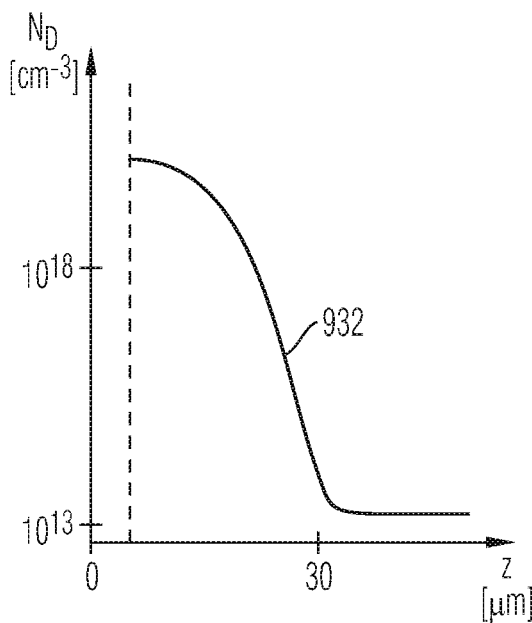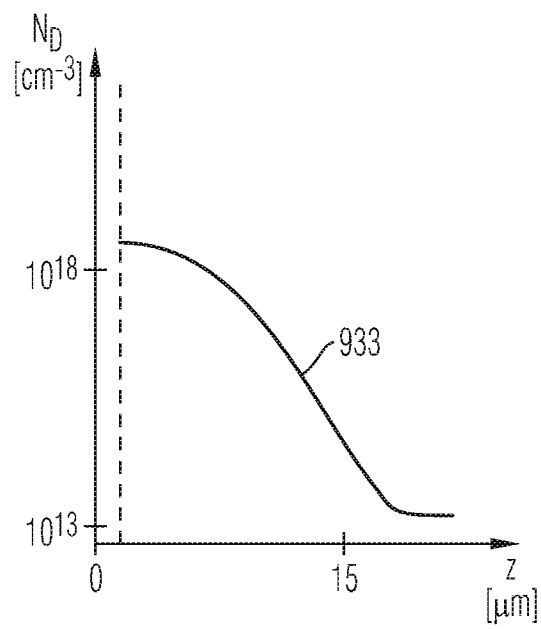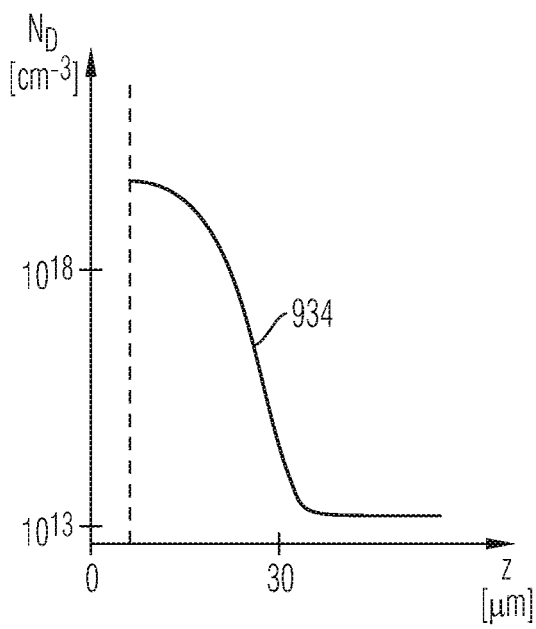

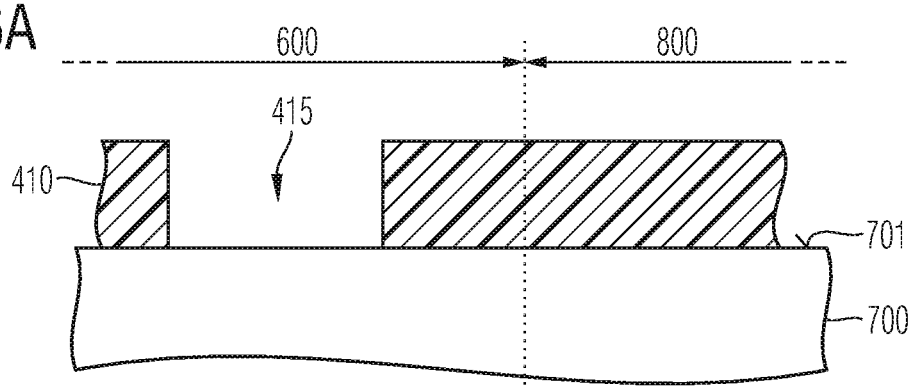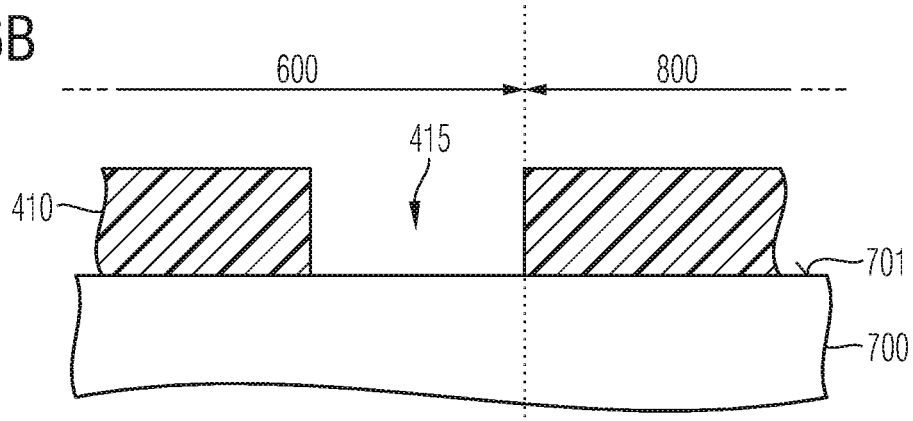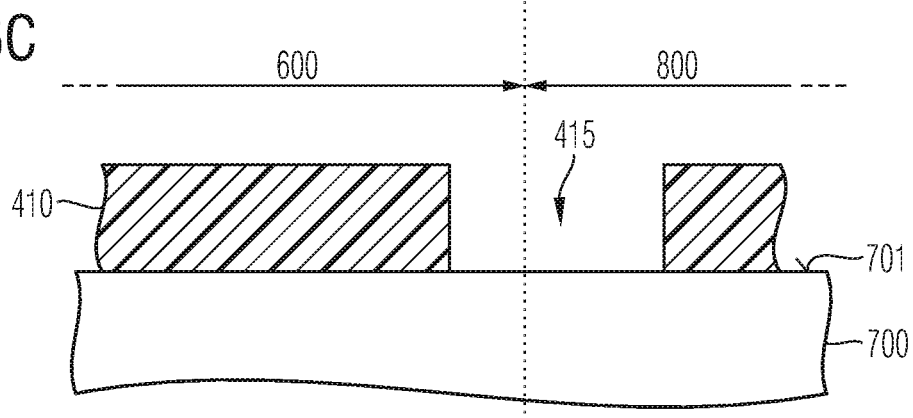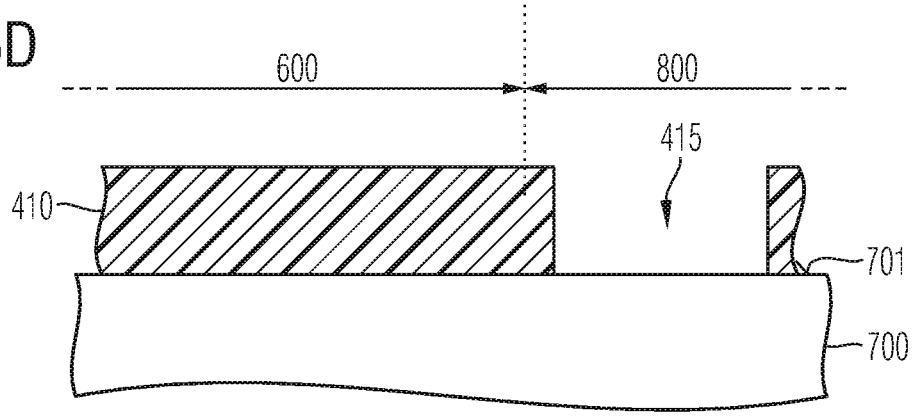

METHOD FOR PRODUCING A SEMICONDUCTOR COMPONENT HAVING A CHANNEL STOPPER REGION

TECHNICAL FIELD

The present application relates to semiconductor components having a comparatively high blocking capability, e.g. power semiconductor diodes and power semiconductor switches.

BACKGROUND

Vertical power semiconductor components are based on a semiconductor body having the first load electrode on the front side and the second load electrode on the rear side of the semiconductor body. In the off-state case, the electric field between the two load electrodes is reduced in a central, active region of the semiconductor body in a vertical direction. Along the side surfaces of the semiconductor body, the blocking capability of the semiconductor body is significantly lower than in the volume and in addition is more difficult to control. Edge termination structures on the component front side aim to reduce the electric field in a lateral direction, such that the side surface of the semiconductor body remains field-free. The edge termination structures can comprise, inter alia, doped channel stopper regions extending near the outer edge of the semiconductor die usually from the front side into the semiconductor body.

The present disclosure is directed to increasing the reliability of edge termination structures.

SUMMARY

The present disclosure relates to a method for producing a semiconductor component. A channel stopper region is formed, which extends in an edge termination region of a component region, said edge termination region being adjacent to a sawing track region, from a first main surface of a semiconductor substrate into a component layer of a first conductivity type and in this case adjoins or else is slightly spaced apart from the sawing track region.

The component region corresponds to a section of the semiconductor substrate which the semiconductor component at least comprises. The sawing track region denotes the part of the semiconductor substrate from which a process that releases the semiconductor components from a semiconductor substrate assemblage can remove material without adversely affecting the component properties of the semiconductor component. By way of example, a sawing process removes material from a sawing track within the sawing track region, which is wider than the actual sawing track. Accordingly, the semiconductor component may still have residual sections of the original sawing track region in each case beside the actual component region along the lateral sides.

Afterward, a doped region of the first conductivity type or of a complementary second conductivity type is formed in the component region at a first distance from the channel stopper region, said doped region extending from the first main surface into the component layer. The channel stopper region is formed by means of a photolithographic method that is carried out before a first photolithographic method for introducing dopants into a section of the component region outside the channel stopper region.

In vertical components having a load current flow between a component front side and a component rear side, in off-state operation the channel stopper region blocks the lateral propagation of a space charge zone toward the component edge. The channel stopper region can be the outermost region on the component front side, the doping of which region is higher than a basic doping. The channel stopper region can completely enclose a central section of the component region.

The early formation of the channel stopper region at a point in time at which further laterally patterned doped regions have not yet been formed in the component region, e.g. the anode region of a semiconductor diode or the source and body regions of transistor cells, makes it possible to use a higher temperature budget for forming the channel stopper region since this temperature budget does not act on other doped regions. The free temperature budget can be utilized for example for deeply indiffusing a suitable dopant or for using only slowly diffusing dopants for the channel stopper region, such that it becomes possible to provide the channel stopper region having a comparatively large vertical extent.

If the vertical extent of the channel stopper region exceeds that of the doped region by at least a factor of 2, for example by a factor of 4 or by more than a factor of 10, then in the off-state case a space charge zone propagating from the inner component region in the direction of the outer edge of the semiconductor body meets the channel stopper region in a section in which areas of identical dopant concentration have a relatively small curvature. Thus, field spikes in the edge termination region are reduced and the blocking capability of the semiconductor component is influenced to a lesser extent by electrical charges that can accumulate at positions that are energetically favorable for them at interfaces in the region of an edge termination structure and/or in passivation layers above the edge termination structure and can adversely influence the electrical field distribution. The robustness of the semiconductor component to withstand external charges and moisture-dictated corrosion is improved. During the production of the semiconductor component, deeply extending channel stopper regions can reduce chipping effects during separation from the wafer assemblage.

In accordance with one embodiment, forming the channel stopper region comprises forming a first dopant mask on the first main surface and introducing a first dopant through a mask opening in the first dopant mask, wherein the mask opening exposes at least one section of the sawing track region which adjoins or is slightly spaced apart from the component region, such that for the same vertical extent the lateral width of the channel stopper region can be reduced and the area efficiency of the semiconductor component can be improved.

The first dopant can be introduced for example through sections of the first main surface that are exposed by the mask opening of the first dopant mask. In accordance with one embodiment, after introducing the first dopant at least one further time a process sequence can be carried out which comprises removing the first dopant mask, applying a further component layer, forming a further first dopant mask having a mask opening that exposes at least one section of the sawing track region that adjoins the component region, and introducing the first dopant through the mask opening.

By means of such a method in which epitaxy and implantation alternate multiply ("Multi-Epi/Multi-Implant"), it is possible to further improve the ratio of the vertical extent to the lateral extent of the channel stopper region.

In accordance with another embodiment, before introducing the first dopant, a trench can be formed that extends from the first main surface into the component layer, such that the first dopant can be introduced into the component layer through an inner surface of the trench. With such a trench it is possible to further improve the ratio of vertical extent to lateral extent of the channel stopper region, without the required temperature budget being increased. The trench can partly or completely be formed in the sawing track region and be filled with doped semiconductor material, wherein the doped semiconductor material can serve as a source of the first dopant. The trench can be formed as a ring trench that laterally completely encloses an active region and can shield the active region from cracks and chipping effects during the separation of individual semiconductor bodies from the semiconductor substrate along a sawing track in the sawing track region.

The channel stopper region can be formed at least partly by thermomigration. For this purpose, an n- or p-doping dopant source is applied on the semiconductor surface to be doped and the dopant is then driven into the wafer by forming a targeted vertical temperature gradient.

In accordance with one embodiment, the first dopant contains phosphorus and/or selenium and/or sulfur. If the introduction of phosphorus and/or selenium and/or sulfur, for example, is followed by a high-temperature treatment at a temperature above 1000° C., which is carried out before forming the doped region in the inner component region, then the first dopant can be distributed over a comparatively deeply extending diffusion region, wherein sections of the diffusion region in the component regions form the channel stopper regions.

The high-temperature treatment of the semiconductor substrate can be carried out for example in an oxygen-containing environment at a temperature above 1000° C., wherein an oxide layer is formed on the first main surface. The formation of channel stopper regions can therefore be linked effectively e.g. with the elimination of crystal defects near the surface as a result of the growth of an oxide layer or with the formation of a screen oxide, such that deep channel stopper regions can be provided with comparatively little additional outlay. In accordance with one embodiment, the indiffusion carried out directly after the introduction of the dopant required for the channel stopper region, said introduction having been carried out e.g. by means of an ion implantation, is carried out at least for a time in a moisture-oxidizing atmosphere, since under these conditions a very high concentration of interstitial silicon is present, which leads to a greatly accelerated diffusion of the phosphorus or selenium atoms.

In accordance with one embodiment, the formation of channel stopper regions comprises a plasma deposition of phosphorus, which enables comparatively high implantation doses of greater than $1\times10^{17}$ cm$^{-2}$. The resultant high density of implanted phosphorus supports the diffusion of phosphorus with a comparatively strong doping gradient and thus enables deep channel stopper regions with a comparatively low temperature/time budget during the furnace process.

Forming the channel stopper region can comprise forming hydrogen-correlated donors in the channel stopper region. Hydrogen-correlated donors can be produced by implanting protons with a comparatively large range in the semiconductor substrate, such that it is possible to further increase the net doping of the channel stopper region at a distance from the first main surface.

The channel stopper region can completely enclose an inner central region of the component region. In the component region a vertical extent of the channel stopper region can decrease strictly monotonically with increasing distance from the sawing track region, and a maximum vertical extent of the channel stopper region perpendicular to the first main surface can be greater than a lateral extent parallel to the first main surface, such that the gain in depth of the channel stopper region scarcely diminishes the area efficiency of a semiconductor component.

The first dopant can be introduced into the edge termination region through the first main surface. In accordance with a further embodiment, a method for producing a semiconductor component comprises introducing a first dopant at least into a section of a sawing track region of a semiconductor substrate, which section adjoins a component region or is spaced apart from the component region, wherein a channel stopper region extending laterally from the sawing track region into the component region is formed. A doped region is formed in the component region and at a distance from the channel stopper region, which doped region forms a pn junction with a drift layer in the semiconductor substrate. A vertical extent of the channel stopper region in the component region can be greater than a lateral extent and in this case in the component region a dopant concentration in the channel stopper region can decrease strictly monotonically with increasing distance from the sawing track region.

Forming a channel stopper region by introducing a dopant at least partly into a section of the sawing track region, which section adjoins the component region or is spaced apart from the component region, enables a comparatively deep and narrow channel stopper region in the component region, such that the robustness of the edge termination structure vis-à-vis charges above the semiconductor surface can be increased with no loss of active area.

The first dopant can comprise at least one of the dopants phosphorus, selenium or sulfur. A high-temperature treatment can outdiffuse the first dopant, wherein the high-temperature treatment can be carried out in an oxidizing atmosphere, and according to one embodiment in a moist oxidizing atmosphere, such that an oxide layer is formed during the high-temperature treatment on the first main surface and the formation of deep channel stopper regions can be linked effectively with the elimination of crystal defects, for example so-called Crystal Originated Particles (COPS).

Before introducing the first dopant, a trench can be formed that extends from the first main surface into the component layer, such that the first dopant can be introduced into the component layer through an inner surface of the trench. With such a trench it is possible to improve the ratio of vertical extent to lateral extent of the channel stopper region even without a high-temperature treatment between introducing the first dopant and forming doped regions in the component region.

Further features and advantages of the disclosed subject matter will become apparent to the person skilled in the art from the following detailed description and also from the drawings.

BRIEF DESCRIPTION OF THE DRAWINGS

The accompanying drawings convey a deeper understanding of the invention, are included in the disclosure and form part thereof. The drawings illustrate embodiments of the present invention and together with the description set out the principles of the invention. Further embodiments of the invention and intended advantages are evident from the understanding of the following detailed description.

FIG. 4A shows a first vertical doping profile for a channel stopper region on the basis of the implantation of phosphorus and a subsequent high-temperature treatment for elucidating the embodiments.

FIG. 4B shows a second vertical doping profile for a channel stopper region on the basis of the implantation of phosphorus and a subsequent high-temperature treatment for elucidating the embodiments.

FIG. 4C shows a third vertical doping profile for a channel stopper region on the basis of the implantation of phosphorus and a subsequent high-temperature treatment for elucidating the embodiments.

FIG. 4D shows a fourth vertical doping profile for a channel stopper region on the basis of the implantation of phosphorus and a subsequent high-temperature treatment for elucidating the embodiments.

FIG. 6A is a schematic vertical cross section through a section of a semiconductor substrate with a first dopant mask in accordance with one embodiment having a mask opening spaced apart from the sawing region.

FIG. 6B is a schematic vertical cross section through a section of a semiconductor substrate with a first dopant mask in accordance with one embodiment having a mask opening adjoining the sawing region.

FIG. 6C is a schematic vertical cross section through a section of a semiconductor substrate with a first dopant mask in accordance with one embodiment having a mask opening overlapping the sawing region.

FIG. 6D is a schematic vertical cross section through a section of a semiconductor substrate with a first dopant mask in accordance with one embodiment having a mask opening formed exclusively in the sawing region.

DETAILED DESCRIPTION

In the following detailed description, reference is made to the accompanying drawings, which form part of the disclosure and show specific exemplary embodiments for illustration purposes. It goes without saying that further exemplary embodiments exist and structural or logical changes can be made to the exemplary embodiments, without departing in the process from what is defined by the patent claims. The description of the exemplary embodiments is non-limiting in this respect. In particular, elements from exemplary embodiments described below can be combined with elements from other exemplary embodiments from among those described, unless something different is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, unless something different is unambiguously evident from the context.

Some figures represent relative dopant concentrations by the indication "–" or "+" next to the doping type. By way of example, "n-" denotes a dopant concentration that is less than the dopant concentration of an "n"-doped region, while an "n+"-doped region has a higher dopant concentration than the "n"-doped region. The indication of the relative dopant concentration does not mean that doped regions with the same relative dopant concentration indication must have the same absolute dopant concentration, unless stated otherwise. By way of example, two different "n"-doped regions can have the same or different absolute dopant concentrations.

Figure 1:
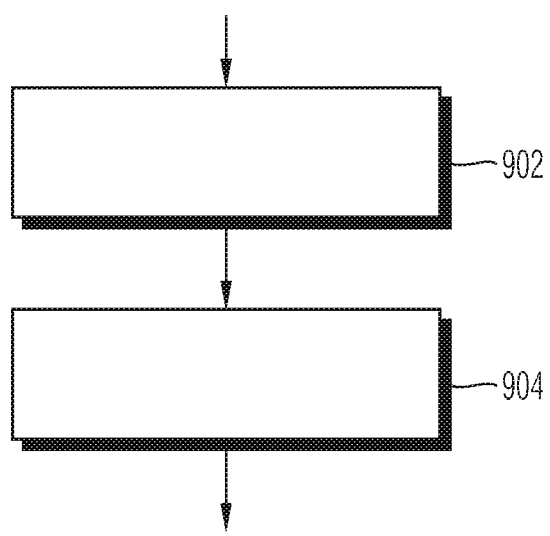
FIG. 1 is a simplified flow diagram for a method for producing a semiconductor component having a deep channel stopper region in accordance with one embodiment.

FIG. 1 relates to a method for producing a semiconductor component, for example a vertical power semiconductor component, for instance a semiconductor diode, an IGBT (insulated gate bipolar transistor) or an HVMOSFET (high voltage metal oxide semiconductor field effect transistor).

A channel stopper region extending from a first main surface into a component layer of a first conductivity type is formed in a component region adjacent to a sawing track region, wherein the channel stopper region can adjoin the sawing track region (902). Afterward, a doped region of the first conductivity type or of a complementary second conductivity type, said doped region extending in the component region from the first main surface into the component layer, is formed at a first distance from the channel stopper region (904). The channel stopper region is formed by means of a photolithographic method that is carried out before a first photolithographic method for introducing dopants into a section of the component region outside the channel stopper region.

Figure 2A:
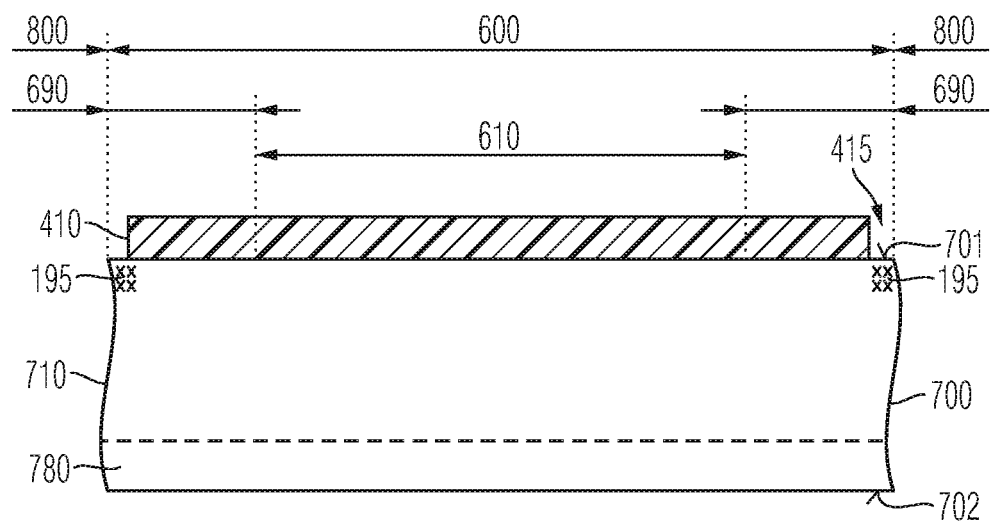
FIG. 2A is a schematic vertical cross section through a section of a semiconductor substrate for illustrating a method for producing a semiconductor component in accordance with one embodiment, after forming a channel stopper region.
Figure 2B:
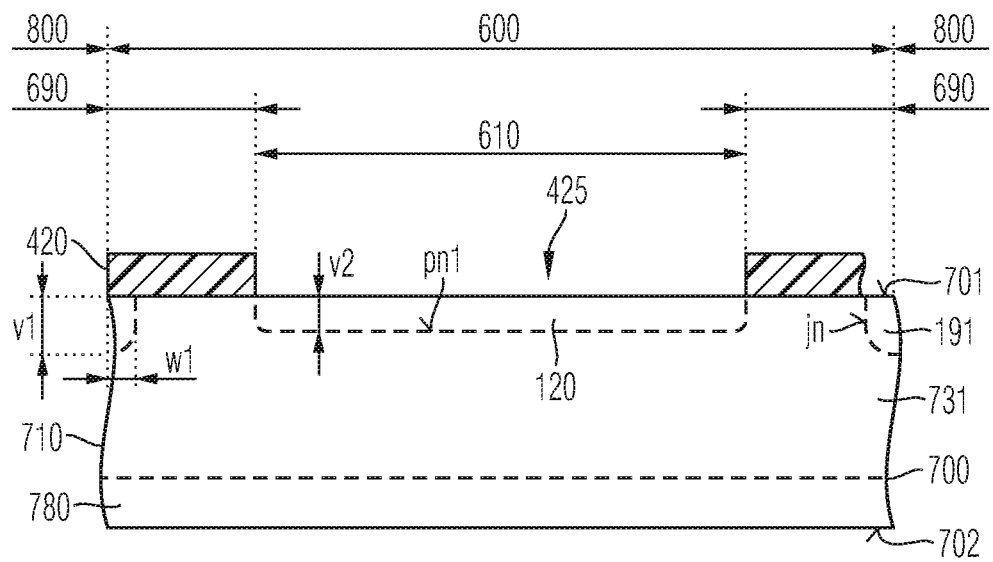
FIG. 2B is a schematic vertical cross section through the semiconductor substrate section according to FIG. 2A, after forming a doped region at a distance from the channel stopper region.

FIGS. 2A and 2B illustrate the method from FIG. 1 on the basis of cross sections through a semiconductor substrate 700.

The semiconductor substrate 700 is based on monocrystalline semiconductor material, for example silicon, germanium, a silicon-germanium mixed crystal, silicon carbide or an $A_{III}B_V$ compound semiconductor, for example GaN or GaAs.

The semiconductor substrate 700 has on the front side a largely planar first main surface 701, and on the rear side a second main surface 702 substantially parallel to the first main surface 701. A direction perpendicular to the first main surface 701 defines a vertical direction. Directions parallel to the first main surface 701 are lateral or horizontal directions.

The semiconductor substrate 700 comprises at least one component layer 710 which is adjacent to the first main surface 701 and which is unpatterned in a lateral direction over its entire vertical and lateral extent, is uniformly doped at least in a lateral direction and has no doped regions separated laterally from one another. The component layer 710 is of a first conductivity type, for example n-doped.

In a vertical direction the dopant concentration in the component layer 710 can be constant or vary depending on the distance from the first main surface 701.

The semiconductor substrate 700 can additionally comprise a substrate section 780 that can have a different conductivity type than the component layer 710. By way of example, the substrate section 780 is a starting substrate which is sawn from a semiconductor crystal upon which the component layer 710 is grown as an epitaxial layer.

The semiconductor substrate 700 has component regions 600, arranged in a regular pattern in columns and rows. A latticelike sawing track region 800 separates adjacent component regions 600 from one another. The component regions 600 each comprise a central active region 610 and an edge termination region 690 laterally enclosing the active region 610 and separating the active region 610 from the sawing track region 800.

The actual sawing track lies within the sawing track region 800 and need not necessarily correspond to a boundary line between the component region 600 and the sawing track region 800, wherein the boundary line can be defined by the fact that a deviation of the sawing track beyond the boundary line into the component region 600 leads to a reduction of the breakdown voltage. In the sawing track region 800 below a channel stopper region, the maximum field strength that occurs when the breakdown voltage is applied is <100 V/cm.

In the active region 610, later such semiconductor elements that determine the nominal functionality of a semiconductor component are formed, for example an anode region of a semiconductor diode, switchable transistor cells of a MOSFET, of an MGD (MOS gated diode), of an IGBT or of a thyristor or a charge collecting zone of a radiation detector. The edge region 690 lacks such semiconductor components. The edge region can have an edge termination structure that ensures a minimum blocking ability of the edge region, e.g. field rings, a JTE (junction termination extension) region or a VLD (variation of lateral doping) region.

A first mask layer is applied on the first main surface 701 and is patterned by means of a photolithographic method. Afterward, through mask openings 415 of a first dopant mask 410 that was produced from the first mask layer, a first dopant 195 is introduced into predefined sections of the component layer 710, wherein the first dopant is of the conductivity type of the component layer 710.

The first dopant 195 can contain phosphorus, selenium, and/or sulfur and hydrogen-correlated donors produced by the implantation of protons for a silicon semiconductor substrate 700 with an n-doped component layer 710, and e.g. aluminum or boron for a semiconductor substrate 700 with a p-doped component layer 710.

FIG. 2A shows the first dopant mask 410 produced from the first mask layer and having a mask opening 415, which can laterally completely enclose the active region 610 and is formed at a distance from the active region 610. The mask opening 415 can be formed completely within the edge termination region 690 and at a distance from the sawing track region 800, can adjoin the sawing track region 800, can be formed exclusively in the sawing track region 800 or can overlap both the edge termination region 690 and the sawing track region 800. The first dopant 195 is introduced into sections of the component layer 710 that are exposed by the mask opening 415.

In the course of a subsequent high-temperature treatment, the first dopant 195 diffuses in a lateral and vertical direction. The first dopant mask 410 is removed. A second mask layer is applied and patterned by means of a photolithographic method. A second dopant is introduced into predefined sections of the component layer 710 through mask openings 425 of a second dopant mask 420 produced from the second mask layer.

FIG. 2B shows the second dopant mask 420 having a mask opening 425 in the active region 610, and also a doped region 120, containing the second dopant, in a section of the component layer 710 that is exposed by the mask opening 425. The doped region 120 forms a first pn junction pn1 with a section of the component layer 710 which remained uninfluenced by the two implantations and which forms a drift layer 731. The doped region 120 forms for example the anode region of a power semiconductor diode or a dopant well for forming body regions of transistor cells of MOSFETs or IGBTs. For simplification, only one continuous body region is illustrated here. In reality, a multiplicity of body regions are usually produced.

The doped region 120 is formed at a lateral distance from a channel stopper region 191, which arises from the vertical and lateral diffusion of the first dopant 195 from FIG. 2A. The channel stopper region 191 is of the same conductivity type as the component layer 710 and forms with the drift layer 731 a unipolar junction jn, for example an n−/n+ junction or a p−/p+ junction, wherein the position of the unipolar junction jn is determined by the locations of maximum dopant concentration change on lines that intersect the unipolar junction jn.

Since, at the point in time of the formation of the channel stopper region 191, no other doped regions have been formed yet in the component layer 710, a high temperature budget is available for forming the channel stopper region 191 and can be utilized for providing the channel stopper region 191 with a comparatively large maximum vertical extent v1 by comparison with a maximum vertical extent v2 of the doped region 120. By way of example, the maximum vertical extent v1 or depth of the channel stopper region 191 is at least double, for example at least five times or at least ten times, a maximum vertical extent v2 of the doped region 120.

If the mask opening 415 of the first dopant mask 410 at least partly overlaps the sawing track region 800, then the lateral area requirement of the channel stopper region 191 within the component region 600 can be reduced further. In accordance with one embodiment, the maximum vertical extent v1 of the channel stopper region 191 is at least of the same magnitude as the maximum lateral extent w1, for example at least double or at least five times the latter.

As a consequence thereof, the unipolar junction jn between the drift layer 731 and the channel stopper region 191 at a distance from the first main surface 701 that corresponds to the maximum vertical extent v2 of the doped region 120 has only a comparatively small curvature, such that in the off-state case a "collision" between the space charge zone and the channel stopper region 191 does not generate field spikes, or generates only such field spikes which are greatly reduced by comparison with field spikes in the case of a "collision" with a section of the channel stopper region having great curvature.

Figure 3A:
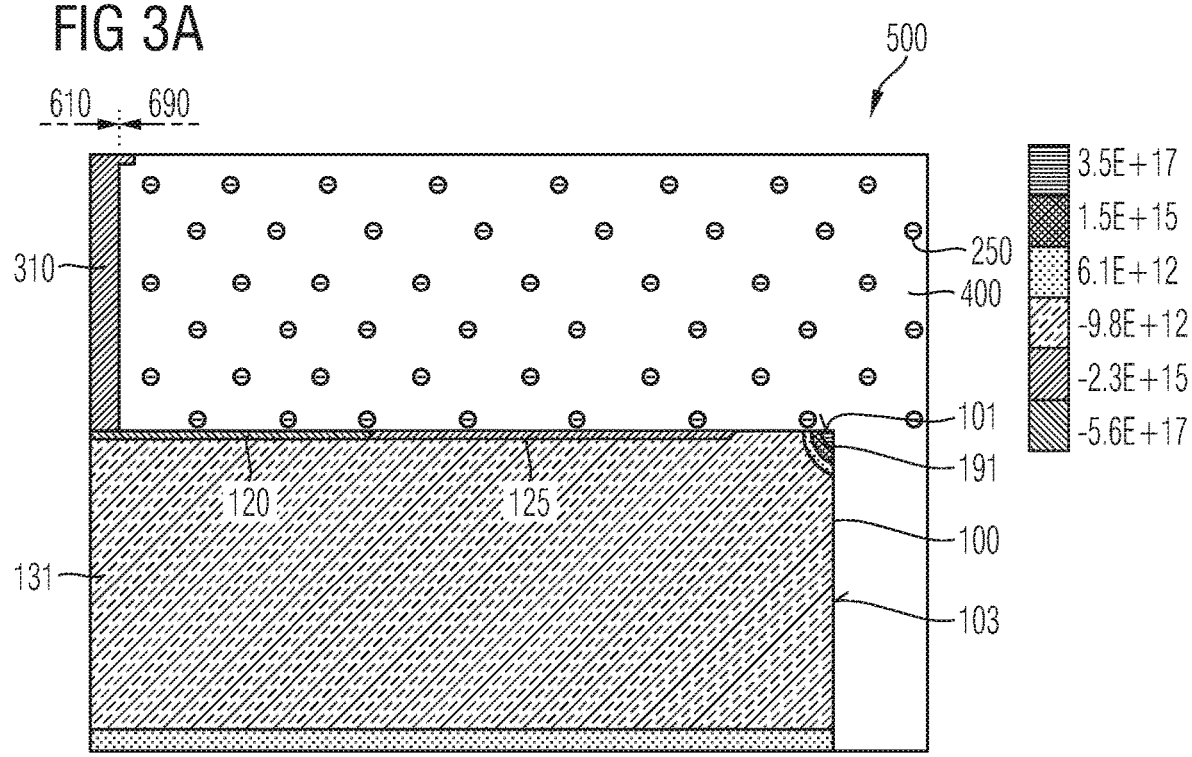
FIG. 3A is a schematic vertical cross section through a semiconductor component having a deep channel stopper region for elucidating the embodiments.
Figure 3B:
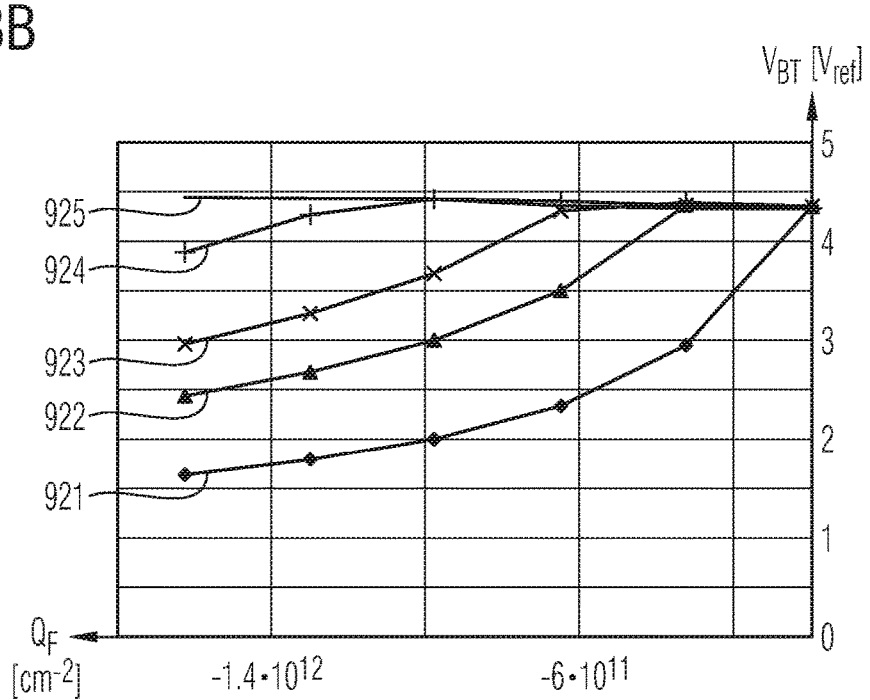
FIG. 3B is a schematic diagram for illustrating the dependence of a breakdown voltage on an external negative charge and on a vertical extent of the deep channel stopper region in accordance with FIG. 3A for elucidating the embodiments.

FIGS. 3A to 3B relate to semiconductor diodes 500 produced with the aid of the method described and having a doped region 120, which forms the anode region on the component front side. In the edge termination region 690, a JTE region 125 is adjacent to the doped region 120. Along a side surface 103 of the semiconductor body 100, an n+ doped channel stopper region 191 extends from a first surface 101 into the semiconductor body 100. The channel stopper region 191 forms an n−/n+ junction with an n−doped drift zone 131, which separates the p-doped regions 120, 125 on the front side from a more highly doped cathode layer on the component rear side, and in which the electric field is reduced in a vertical direction in the off-state case.

The maximum dopant concentration in the channel stopper region 191 is approximately $5 \times 10^{18}$ cm$^{-3}$. A maximum vertical extent v1 of the channel stopper region 191 is approximately double a maximum lateral extent w1 and approximately five times the maximum vertical extent v2 of the doped regions 120, 125.

A first load electrode 310 contacts the doped region 120 on the component front side in the active region 610. A passivation layer 400 bears on the semiconductor body 100 in the edge termination region 690, laterally borders the first load electrode 310 and can cover a partial section of the first load electrode 310. In the passivation layer 400, negative electrical charges 250 are indicated schematically, for example OH$^-$ ions, fluorine ions or lithium ions, which can accumulate at locations energetically favorable for them in the passivation layer 400.

In FIG. 3B, a first line 921 indicates the dependence of the breakdown voltage $V_{PT}$ of the edge termination region 690 as a function of an outer integrated charge density $Q_F$ in the volume of the passivation layer 400 for a maximum vertical extent v1 of the channel stopper region 191 from FIG. 3A of 4 µm, a second line 922 for v1=20 µm, a third line 923 for v1=40 µm, a fourth line 924 for v1=100 µm, and a fifth line 925 for v1=200 µm. The more deeply the channel stopper region 191 extends, the smaller the influence of negative electrical charge present in the passivation layer 400 on the breakdown voltage. Starting at a vertical extent or depth of 200 µm, an influence of the negative charge on the breakdown voltage which reduces the blocking capability is no longer discernible.

FIGS. 4A to 4D relate to a deep indiffusion of phosphorus for forming a channel stopper region 191 in a semiconductor substrate based on silicon, wherein the indiffusion of phosphorus can be combined with the diffusion of selenium and/or sulfur. In order that the maximum lateral extent w1 of the channel stopper region 191 is kept small, phosphorus can be introduced at least partly or exclusively in the region of the sawing track, such that the majority of the diffusion region produced by diffusion of phosphorus is removed during the process of sawing for separating the individual components from the semiconductor substrate and only a relatively narrow region of the lateral outdiffusion remains in the finalized semiconductor component.

FIG. 4A shows a first vertical dopant distribution 931 for a channel stopper region originating from a phosphorus implantation dose of $5 \times 10^{15}$ cm$^{-2}$ with an implantation energy of 100 keV. After a high-temperature treatment at 1150° C. for 20 hours, the depth of the channel stopper region 191 is approximately 20 µm. If the high-temperature treatment is carried out in an oxidizing atmosphere, then a 20 nm thick oxide layer grows in the same period of time.

In accordance with one embodiment, the implantation of phosphorus is carried out by means of plasma deposition with an implantation dose of greater than $10^{17}$ cm$^{-2}$.

By way of example, FIG. 4B shows a second vertical dopant distribution 932 of the channel stopper region for a phosphorus implantation dose of a plasma deposition of $2 \times 10^{17}$ cm$^{-2}$ with an implantation energy of 100 keV after a high-temperature treatment at 1150° C. for 20 hours. The depth of the channel stopper region is just under 30 µm.

For example in silicon semiconductor components having a nominal reverse voltage of 1.2 kV and a vertical drift zone extent of approximately 90 µm, a channel stopper region having a vertical extent of approximately 30 µm significantly reduces the dependence of the breakdown voltage on negative charges in the passivation layer.

FIGS. 4C and 4D show a third and a fourth vertical dopant distribution 933, 934, respectively, with the implantation parameters from FIGS. 4A and 4B after a high-temperature treatment at 1106° C. for 30 hours. The penetration depths attained are approximately 16 μm and just under 30 μm, respectively.

A first dopant mask 410 is formed on a first main surface 701 of a semiconductor substrate 700 composed of monocrystalline silicon with a component layer 710 adjacent to the first main surface 701. Through a lattice-shaped mask opening 415 or a plurality of frame-like mask openings 415 in the first dopant mask 410, phosphorus with a dose of at least $10^{15}$ cm$^{-2}$, for example with a dose of at least $10^{16}$ cm$^{-2}$ or of at least $10^{17}$ cm$^{-2}$, is implanted into the component layer 710. The implantation of phosphorus can comprise a plasma deposition. The implantation energy can be in the range of between 50 keV and 200 keV, for example approximately 100 keV.

Figure 5A:
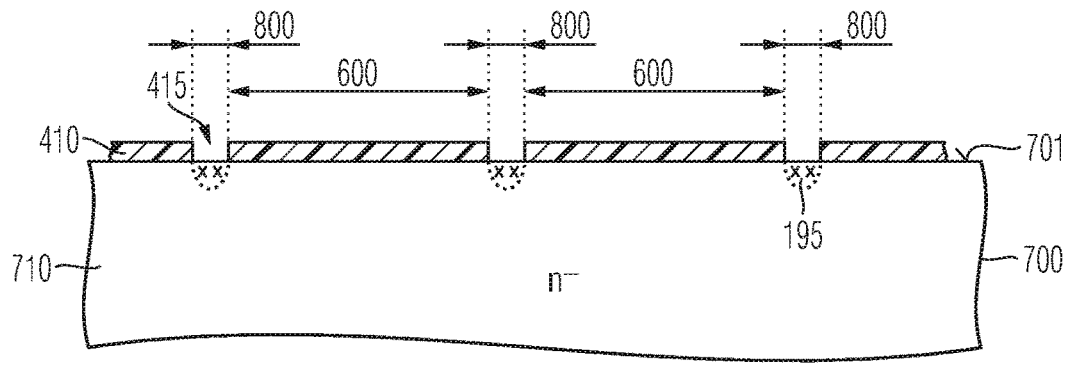
FIG. 5A is a schematic vertical cross section through a section of a semiconductor substrate for illustrating a method for producing deep, n-doped channel stopper regions in accordance with one embodiment comprising a phosphorus implantation with a high dose, after the implantation of phosphorus.

FIG. 5A shows the introduced phosphorus atoms of the first dopant 195 in the vertical projection of the mask opening 415 in the first dopant mask 410. In the exemplary embodiment depicted, the first dopant mask 410 completely covers the component region 600 of the semiconductor substrate 700 and the mask opening 415 exposes at least one part of the sawing track region 800. In accordance with other embodiments, the mask opening 415 can laterally overlap the component regions 600 or can be formed only in a central region of the sawing track region 800. According to another embodiment, each component region is assigned a frame-like mask opening, these being formed in each case exclusively within the component region 600, exclusively within the sawing track region 800 or in a manner overlapping the component region 600 and the sawing track region 800.

The implantation of phosphorus and the removal of the first dopant mask 410 are followed by a high-temperature step at a temperature above 1000° C., in accordance with one embodiment at a temperature above 1100° C. The high-temperature step can serve exclusively for the diffusion of phosphorus, or serve a further purpose besides the diffusion of phosphorus, for example for forming an oxide layer on the first main surface 701. By way of example, in the high-temperature step, the semiconductor substrate 700 is kept at a temperature of at least 1000° C. or at least 1100° C. in an oxidizing atmosphere for a time duration of at least one hour, for example at least three hours, wherein an oxide layer 210 is formed on the first main surface 701. In accordance with one embodiment, the oxidation is carried out in a moist atmosphere.

Figure 5B:
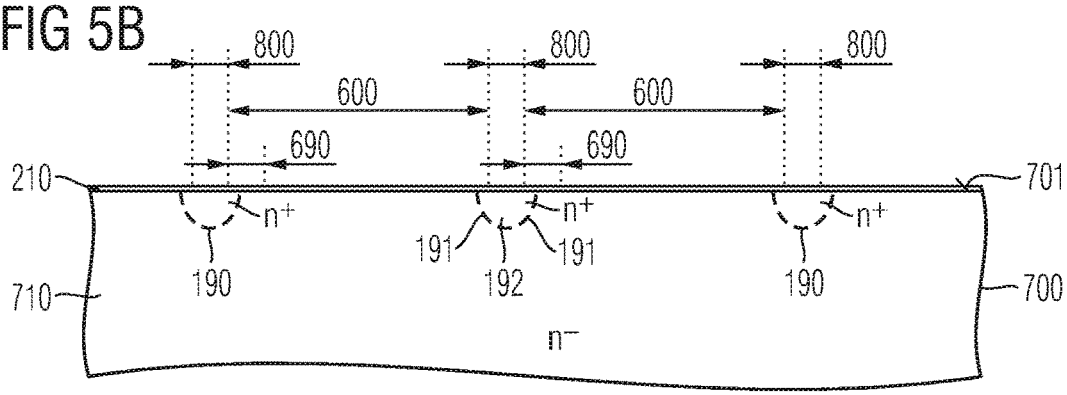
FIG. 5B is a schematic vertical cross section through the semiconductor substrate section according to FIG. 5A after a high-temperature treatment.

FIG. 5B shows the oxide layer 210 on the first main surface 701 and also the diffusion regions 190 formed by lateral and vertical diffusion of the implanted phosphorus atoms. The diffusion regions 190 comprise first sections, which form channel stopper regions 191 in the component regions 600, and also second sections 192 in the sawing track region 800. A layer thickness of the oxide layer 210 is a few nanometers, e.g. at least 5 nm or at least 10 nm or else more than 100 nm or, in the event of a moist oxidation being used, even more than 1000 nm. The oxide layer 210 can be a sacrificial oxide, the formation and subsequent removal of which are used to remove crystal defects near the surface. The oxide layer 210 can also function as a screen oxide layer for a subsequent implantation.

A second dopant mask 420 is formed on the oxide layer 210 or, after the removal of the oxide layer 210, directly on the first main surface 701, which second dopant mask covers at least one outer section of the edge termination regions 690 of the component regions 600 and in addition can completely cover the sawing track region 800. Mask openings 425 in the second dopant mask 420 expose at least the central active regions 610 of the component regions 600. A second dopant of the p conduction type is implanted through the mask openings 425.

Figure 5C:
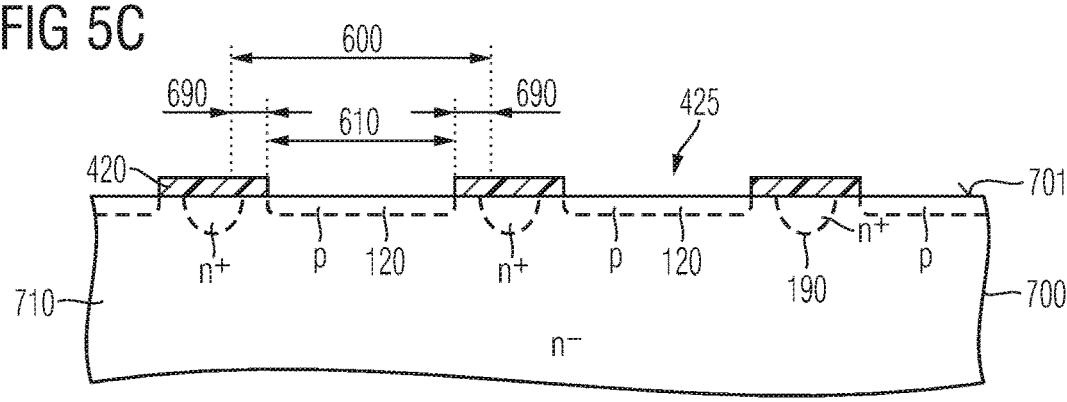
FIG. 5C is a schematic vertical cross section through the semiconductor substrate section according to FIG. 5B after forming p-doped regions at a distance from the channel stopper regions.

FIG. 5C shows second doped regions 120 formed by the implantation of the second dopant, which second doped regions, near the front side of the substrate, form a first pn junction pn1 with a drift layer 731 comprising a section of the component layer 710 outside the doped regions 120 and outside the diffusion regions 190. The doped regions 120 are formed at a distance from the diffusion regions 190. One or a plurality of further implantations can form, in the region between the doped regions 120 and the diffusion regions 190, further p-doped regions 125 or n-doped regions of an edge termination structure, for example field rings, JTE regions or VLD regions. A section of the drift layer 731 which adjoins the first main surface 701 can separate the outermost doped region of such an edge termination structure, e.g. the p-doped region 125 of a JTE, from the diffusion regions 190.

After further method steps, individual semiconductor bodies 100 are obtained from the semiconductor substrate 700 for example by means of a sawing process. During the sawing process, sections of the semiconductor substrate 700 with the second sections 192 of the diffusion regions 190 are partly or completely consumed.

Figure 5D:
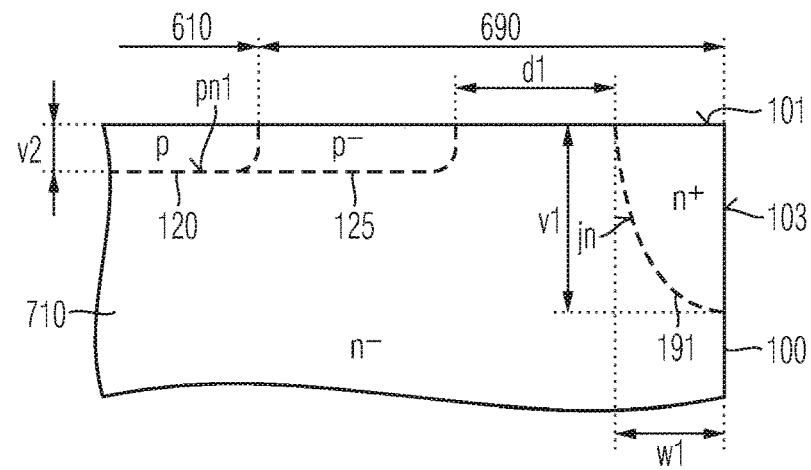
FIG. 5D is a schematic vertical cross section through a semiconductor body of a semiconductor component, said semiconductor body having been separated from the semiconductor substrate section according to FIG. 5C by sawing.

FIG. 5D shows a section of a semiconductor body 100 that has been separated from the semiconductor substrate 700 from FIG. 5C by means of a sawing process.

A p-doped region 120 in the active region 610 forms a first pn junction pn1 with a drift zone 131 formed from a section of the drift layer 731 from FIG. 5C. The p-doped region 120 forms for example the anode region of a semiconductor diode or a p-well for the body regions of transistor cells of a MOSFET. A further p-doped region 125, which can adjoin the p-doped region 120, is formed in the edge termination region.

A channel stopper region 191 forms an n−/n+ junction jn with the drift zone 131, wherein a section of the drift zone 131 which adjoins the first surface 101 of the semiconductor body 100 separates the channel stopper region 191 from the closest doped region of the complementary conductivity type. In this case, the position of the n−/n+ junction jn is determined by locations of maximum dopant concentration change on lines that intersect the n−/n+ junction. The channel stopper region 191 is formed in a lateral direction at a lateral distance d1 from the closest p-doped region 120, 125, wherein the lateral distance d1 given a thickness D of the semiconductor body 100 between the first surface 101 and a second surface opposite the first surface 101 is at least D/20 and at most 2×D.

A maximum vertical extent v1 of the channel stopper region 191 exceeds a maximum vertical extent v2 of the p-doped region 120 by at least double, for example by at least five-fold or at least ten-fold. The maximum vertical extent v1 of the channel stopper region 191 can be less than, equal to or greater than the distance between a lower edge of the drift zone 131 and the first surface 101. By way of example, the maximum vertical extent v1 of the channel stopper region 191 is at least 20% and at most 100% of the distance d3.

Within the channel stopper region 191, a dopant concentration can fall monotonically, e.g. strictly monotonically, with increasing distance from the side surface 103. The channel stopper region 191 can have the maximum vertical extent v1 at the side surface 103. The vertical extent can decrease monotonically, for example strictly monotonically, with increasing distance from the side surface 103.

FIGS. 6A to 6D show various embodiments for the first dopant mask 410 for the implantation of the first dopant.

In FIG. 6A, the first dopant mask 410 has a plurality of frame-like mask openings 415, which in each case laterally frame an active region 610 of a component region 600 and are spaced apart both from the sawing track region 800 and from the active regions 610.

FIG. 6B shows frame-like mask openings 415, that directly adjoin the sawing track region 800. FIG. 6C shows frame-like mask openings 415, that in each case partly overlap an outermost section of an edge termination region 690 of a component region 600 and sections of the sawing track region 800 that adjoin the component regions 600.

In FIG. 6D, the mask openings 415 are formed completely in the sawing track region 800. Instead of a multiplicity of frame-like mask openings 415, the dopant mask 410 can have a single, latticelike mask opening 415, which exposes at least one central section of the sawing track region 800, and can expose outermost sections of the edge termination regions 690 of the component regions 600.

FIGS. 7A to 7E show different positions of a sawing track 810 relative to a component region 690. A separation process, e.g. sawing, laser dicing, or etching, which divides the semiconductor substrate 710 into individual semiconductor bodies, removes a section 795 of the semiconductor substrate 710 in the sawing track 810. A lateral width of the sawing track 810 can be tens of micrometers. The sawing track region 800 corresponds to a tolerance window for a permissible lateral position deviation of the sawing track 810.

A boundary line 681 between the sawing track region 800 and the component region 600 can be defined by the fact that a lateral deviation of the sawing track 810 into the component region 600 causes the breakdown voltage of the component to fall below a predefined threshold.

Figure 7A:
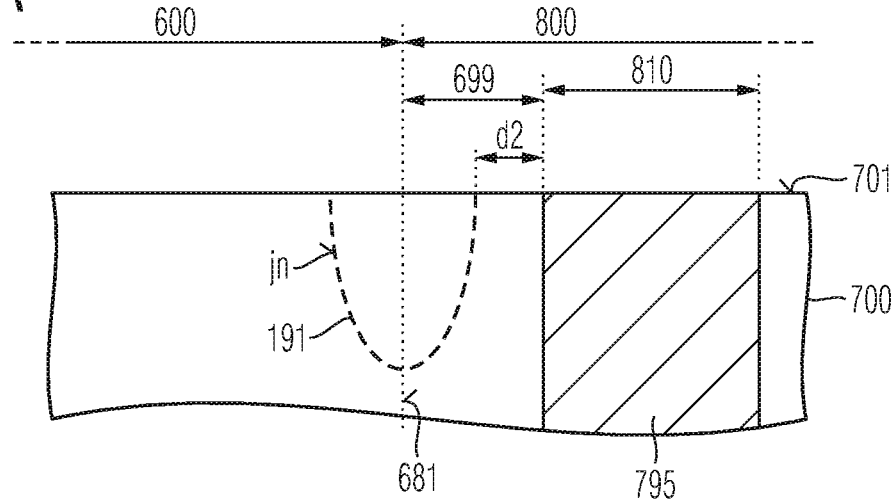
FIG. 7A is a schematic vertical cross section through a section of a semiconductor substrate in accordance with one embodiment with a sawing track at a distance from a channel stopper region.
Figure 7B:
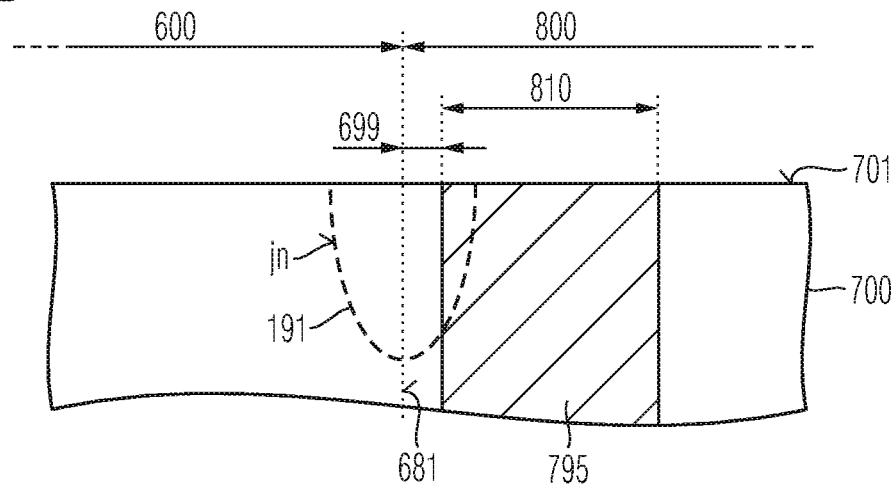
FIG. 7B is a schematic vertical cross section through a section of a semiconductor substrate in accordance with one embodiment with a sawing track adjoining a channel stopper region.
Figure 7C:
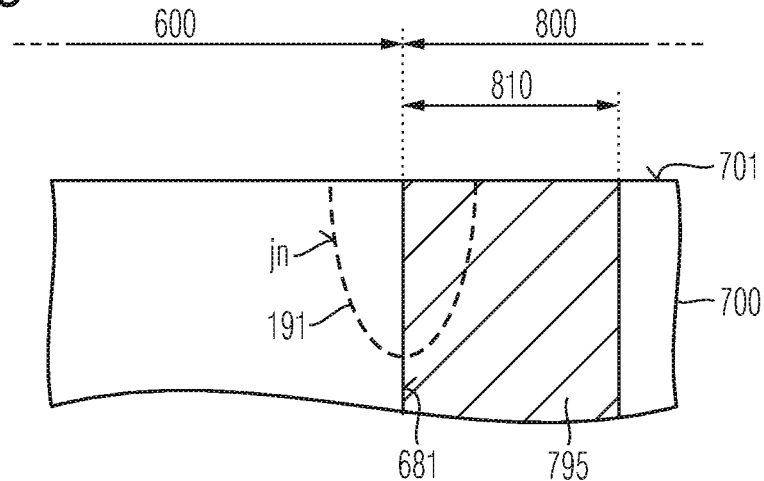
FIG. 7C is a schematic vertical cross section through a section of a further semiconductor substrate in accordance with one embodiment with a sawing track adjoining a channel stopper region.

In the embodiments in FIGS. 7A to 7C, the boundary line 681 passes through the lateral center of the channel stopper region 191 before the separation process.

In FIG. 7A, the sawing track 810 extends at a distance d2 from the channel stopper region 191. A semiconductor component obtained from the semiconductor substrate 700 comprises a residual section 699 of the sawing track region 800 besides the component region 600. The distance d2 between the sawing track 810 and the channel stopper region 191 can be in the range of 0 μm to 200 μm, for example in a range of 10 μm to 100 μm or of 20 μm to 50 μm.

In FIG. 7B, the sawing track 810 adjoins the channel stopper region 191. In FIG. 7C, the sawing track 810 directly adjoins the boundary line 681.

Figure 7D:
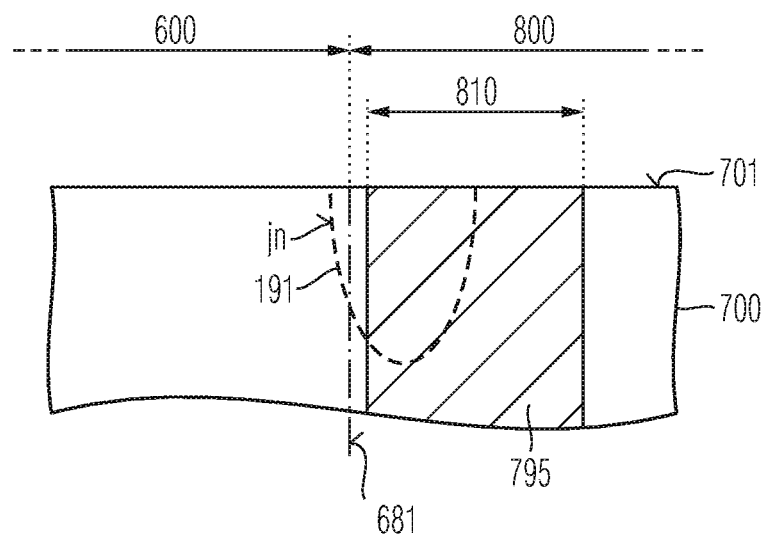
FIG. 7D is a schematic vertical cross section through a section of a semiconductor substrate in accordance with another embodiment with a sawing track adjoining a channel stopper region.

In FIG. 7D, the boundary line 681 is displaced from the lateral center of the channel stopper region 191 before the separation process further in the direction of the component region 600, such that the channel stopper region 191 formed in the component region 600 comprises less than 50% of the channel stopper region before the separation process. If the sawing track 810 precisely reaches the boundary line 681, this results in a narrow channel stopper region 191, the vertical extent of which initially decreases from the component edge.

Figure 7E:
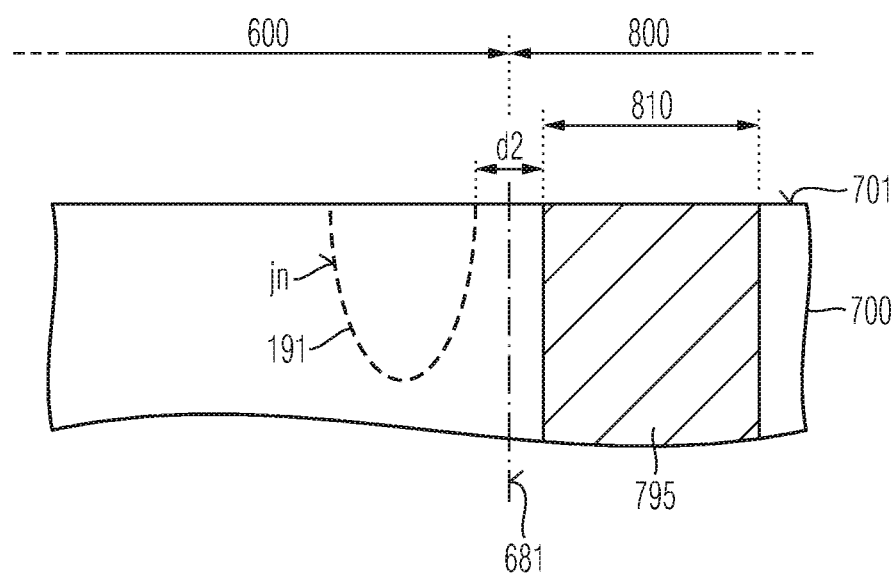
FIG. 7E is a schematic vertical cross section through a section of a semiconductor substrate in accordance with one embodiment with a channel stopper region that is spaced apart from the sawing track region.

In FIG. 7E, the channel stopper region 191 is formed at a distance from the sawing track 810 and is maintained during the separation process. The distance d2 between the sawing track 810 and the channel stopper region 191 can be in the range of 0 μm to 200 μm, for example in a range of 10 μm to 100 μm or of 20 μm to 50 μm.

FIGS. 8A to 8D relate to the formation of channel stopper regions 191 by introducing the first dopant through inner surfaces of trenches 790.

A trench etching mask 430 is formed on the first main surface 701, wherein mask openings 435 in the trench etching mask 430 are aligned with the component regions 600 and with the sawing track region 800. In the exemplary embodiment depicted, the trench etching mask 735 has a plurality of frame-like mask openings that in each case are formed along a separating line between component region 600 and sawing track region and overlap the component region 600, the sawing track region 800, or both.

By means of a directional etch, for example by means of an ion beam etching method, in the vertical projection of the mask openings 435 trenches 790 are introduced into the component layer 710 of the semiconductor substrate 700. A first dopant, for example, phosphorus, selenium or sulfur, is introduced through the inner surfaces of the trenches 790.

Introducing the first dopant can be carried out by means of a masked implantation or a masked indiffusion by means of a first dopant mask, wherein the first dopant mask can be for example the trench etching mask 430. In accordance with another embodiment, the trenches 790 can be filled with doped material, for example with doped semiconductor material, such that introducing the first dopant comprises outdiffusion from the doped material.

Figure 8A:
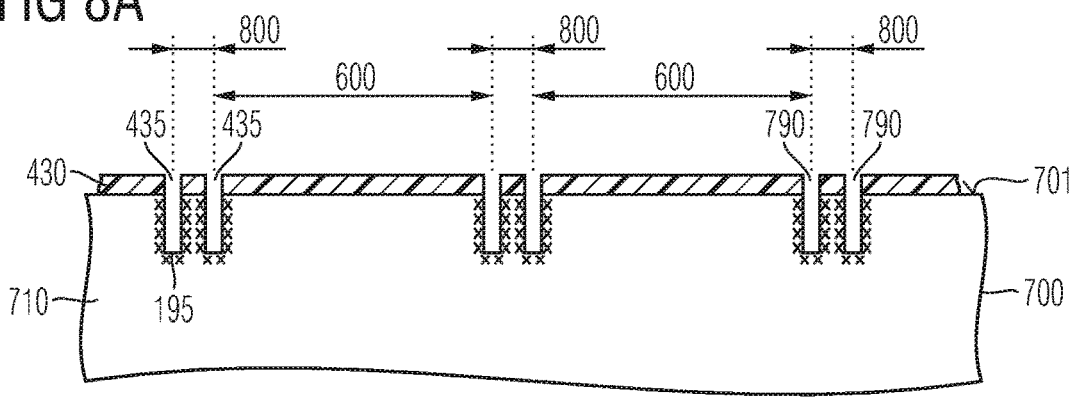
FIG. 8A is a schematic vertical cross section through a section of a semiconductor substrate for illustrating a method for producing deep n-doped channel stopper regions in accordance with one embodiment comprising forming trenches, after forming the trenches.

FIG. 8A shows the first dopant 195 introduced in the region of the trenches 790 for the case where the first dopant 195 is introduced by implantation or indiffusion from a gas phase. The dopant mask is removed and the trenches 790 are filled. By means of a high-temperature treatment, for example by means of a high-temperature step for forming an oxide layer 210, the first dopant atoms are diffused vertically and laterally. In order to dope the sidewalls of the trenches sufficiently, for the case of implantation an oblique implantation can be used or else a plasma deposition which can cause an approximately homogenous sidewall/trench bottom covering with dopants.

Figure 8B:
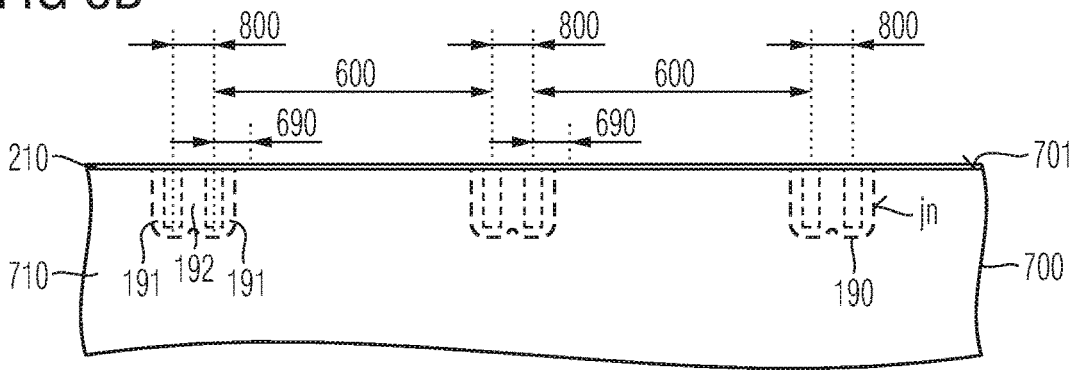
FIG. 8B is a schematic vertical cross section through the semiconductor substrate section according to FIG. 8A after a high-temperature treatment.

FIG. 8B shows the oxide layer 210 on the first main surface 701 and also diffusion regions 190 with an n−/n+ junction jn that is almost vertical over a wide extent.

Figure 8C:
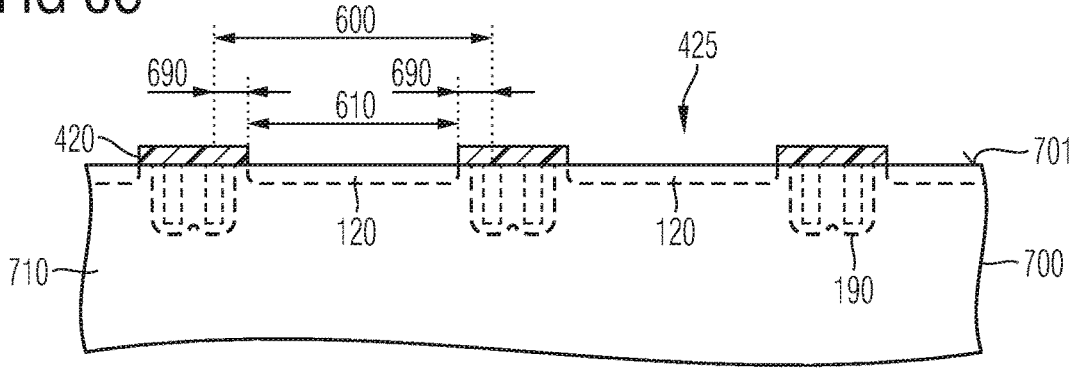
FIG. 8C is a schematic vertical cross section through the semiconductor substrate section according to FIG. 8B after forming p-doped regions at a distance from the channel stopper regions.
Figure 8D:
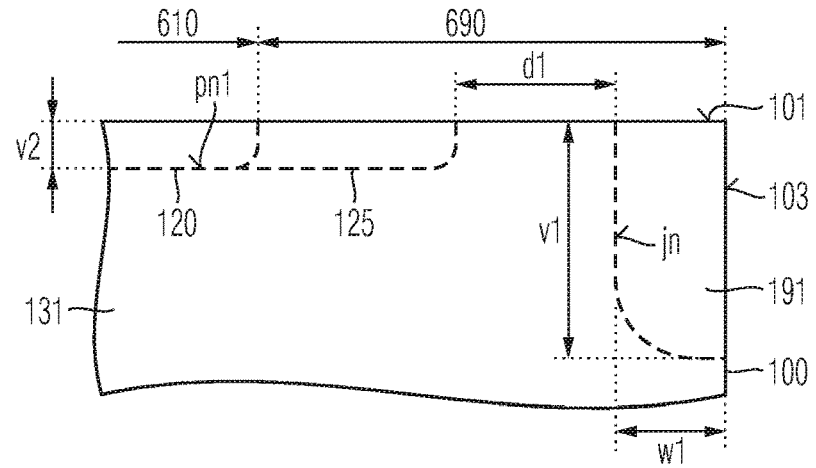
FIG. 8D is a schematic vertical cross section through a semiconductor body of a semiconductor component, said semiconductor body having been separated from the semiconductor substrate section according to FIG. 8C by sawing.

FIGS. 8C and 8D relate to processing similar to that already described for FIGS. 5C and 5D. In accordance with FIG. 8D, channel stopper regions 191 defined by way of a trench etching method have n−/n+ junctions jn that are almost vertical over wide extents. The region in which the space charge zone meets the channel stopper region 191 in the off-state case has hardly any curvature. The blocking ability of the component is therefore comparatively insensitive to charges in a passivation layer above the first surface.

Figure 9:
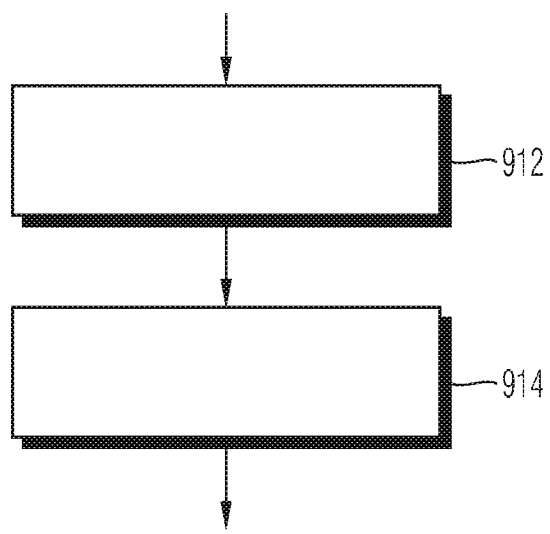
FIG. 9 is a simplified flow diagram for a method for producing a semiconductor component having a deep channel stopper region in accordance with a further embodiment.

FIG. 9 relates to a further method for producing a semiconductor component. A first dopant is introduced at least into a section of a sawing track region of a semiconductor substrate, which section adjoins a component region (912), wherein a channel stopper region extending laterally from the sawing track region into a component region is formed. In the semiconductor substrate doped regions are formed at a lateral distance from the channel stopper region, which doped regions form pn junctions with a drift layer (914), wherein a maximum vertical extent of the channel stopper region perpendicular to a first main surface is at least double the magnitude of a maximum vertical extent of the doped regions.

For a silicon carbide semiconductor substrate 700, introducing the first dopant can comprise one or a plurality of implantations with a higher implantation energy than is used later for forming a doped region in the active region, wherein each implantation can be carried out by means of an energy diffuser which is arranged in the beam path and which brings about a more uniform vertical distribution of the first dopant 195.

Figure 10A:
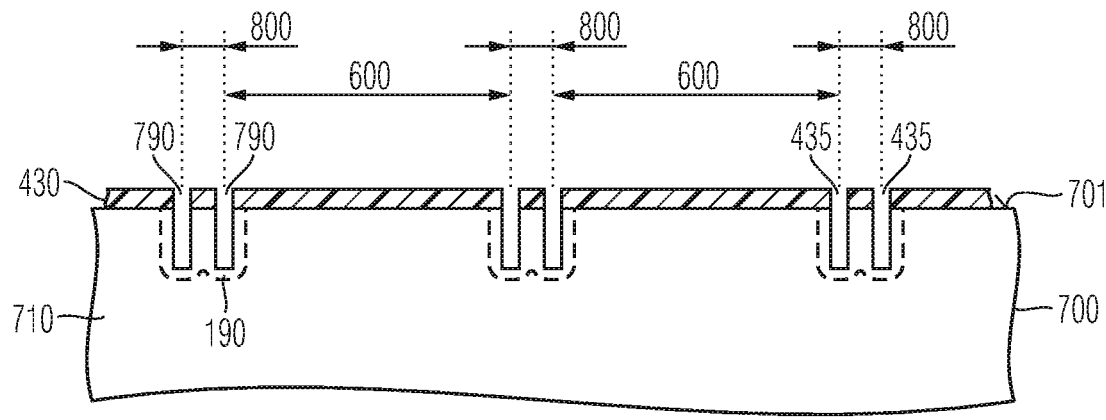
FIG. 10A is a schematic vertical cross section through a section of a semiconductor substrate for illustrating a method for producing deep channel stopper regions in accordance with one embodiment comprising forming trenches, after forming the trenches.
Figure 10B:
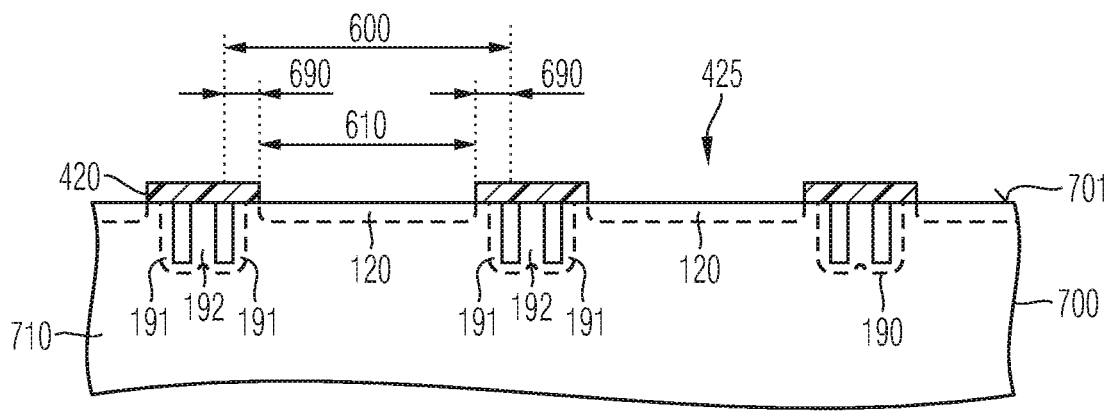
FIG. 10B is a schematic vertical cross section through the semiconductor substrate section according to FIG. 10B after forming doped regions at a distance from the channel stopper regions.
Figure 10C:
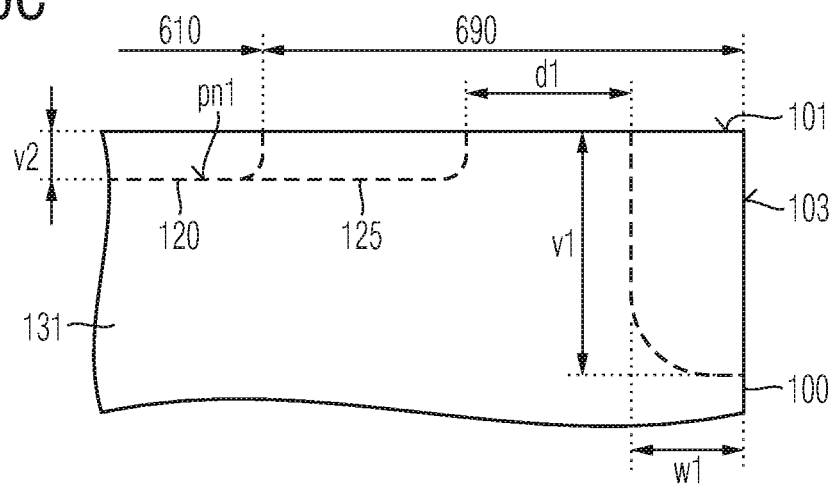
FIG. 10C is a schematic vertical cross section through a semiconductor body of a semiconductor component, said semiconductor body having been separated from the semiconductor substrate section according to FIG. 10B by sawing.

FIGS. 10A to 10C relate to a further method for forming channel stopper regions 191 by introducing the first dopant through inner surfaces of trenches 790.

In the vertical projection of mask openings 435 of a trench etching mask 730, trenches 790 are introduced into a component layer 710 of a semiconductor substrate 700. A first dopant, for example phosphorus, selenium, sulfur, arsenic, is introduced into the component layer 710 through the inner surfaces of the trenches 790.

FIG. 10A shows the diffusion regions 190 formed by introducing the first dopant in the region of the trenches 790. The formation of the diffusion regions 190 can comprise a high-temperature step. In accordance with one embodiment, the diffusion regions 190 are formed without a high-temperature step.

FIG. 10B shows p-doped regions 120, 125, that are formed in the further course or else already before the diffusion regions 190 in the component region 600 and at a distance from the diffusion regions 190.

FIG. 10C shows a channel stopper region 191 formed from a first section of a diffusion region 190 from FIG. 10B, which channel stopper region has hardly any curvature over a large region of its vertical extent and the blocking ability of which channel stopper region is thus largely insensitive to charges in a passivation layer of a semiconductor component above a first surface 101 of a semiconductor body 100.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed herein. Therefore, the invention is restricted only by the claims and the equivalents thereof.

What is claimed is:

1. A method for producing a semiconductor component, the method comprising:
   forming a channel stopper region extending from a first main surface into a component layer of a first conductivity type in an edge termination region of a component region, the edge termination region being adjacent to a sawing track region; and
   forming a doped region extending in the component region from the first main surface into the component layer,
   wherein the channel stopper region is formed by a photolithographic method that is carried out before a first photolithographic method for introducing dopants into a section of the component region outside the channel stopper region,
   wherein forming the channel stopper region comprises forming a first dopant mask on the first main surface and introducing a first dopant through a mask opening of the first dopant mask, the mask opening exposing at least one section of the sawing track region,
   wherein the first dopant is introduced through sections of the first main surface that are exposed by the mask opening of the first dopant mask,
   wherein after introducing the first dopant at least one further time, a process sequence is carried out which comprises:
   removing the first dopant mask;
   applying a further component layer on the first main surface;
   forming a further first dopant mask having a mask opening that exposes at least one section of the sawing track region; and
   introducing the first dopant through the mask opening in the further first dopant mask.

2. The method of claim 1, wherein the channel stopper region adjoins the sawing track region or extends into the sawing track region.

3. The method of claim 1, wherein the channel stopper region is spaced apart from the sawing track region.

4. The method of claim 1, wherein before introducing the first dopant, a trench is formed that extends from the first main surface into the component layer, and wherein the first dopant is introduced into the component layer through an inner surface of the trench.

5. The method of claim 4, wherein the trench is formed at least partly in the sawing track region.

6. The method of claim 4, wherein the trench is filled with a doped semiconductor material of the first conductivity type.

7. The method of claim 1, wherein the channel stopper region is formed at least partly by thermomigration.

8. The method of claim 1, wherein the first dopant comprises selenium, sulfur and/or phosphorus.

9. The method of claim 1, wherein forming the channel stopper region comprises a high-temperature treatment at a temperature of at least 1000° C., wherein the high-temperature treatment is carried out after introducing the first dopant and before forming the doped region, wherein the first dopant is distributed over a diffusion region as a result of the high-temperature treatment, and wherein a first section of the diffusion region in the component region forms the channel stopper region.

10. The method of claim 9, wherein the high-temperature treatment is carried out at a temperature above 1000° C. and in an oxygen-containing environment, and wherein an oxide layer is formed on the first main surface.

11. The method of claim 1, wherein forming the channel stopper region comprises a plasma deposition of phosphorus.

12. The method of claim 1, wherein forming the channel stopper region comprises forming hydrogen-correlated donors in the channel stopper region.

13. The method of claim 1, wherein the channel stopper region completely encloses the active region.

14. The method of claim 1, wherein a maximum vertical extent of the channel stopper region perpendicular to the first main surface is at least double a magnitude of a maximum vertical extent of the doped region.

15. The method of claim 1, wherein in the component region a vertical extent of the channel stopper region decreases monotonically with increasing distance from the sawing track region.

16. The method of claim 1, wherein in the component region a maximum vertical extent of the channel stopper region perpendicular to the first main surface is greater than a maximum lateral extent of the channel stopper region in the component region parallel to the first main surface.

17. The method of claim 1, wherein a section of the component layer forms a drift layer of the semiconductor component, and wherein the channel stopper region is of the same conductivity type as the component layer and forms a unipolar junction with the drift layer.

18. The method of claim 1, wherein at the point in time of the formation of the channel stopper region, no other doped regions have been formed yet in the component layer.

19. The method of claim 1, wherein a higher temperature budget is used for forming the channel stopper region than for all other doped regions subsequently formed in the component region.

20. A method for producing a semiconductor component, the method comprising:
    forming a channel stopper region extending from a first main surface into a component layer of a first conductivity type in an edge termination region of a component region, the edge termination region being adjacent to a sawing track region; and
    forming a doped region extending in the component region from the first main surface into the component layer,
    wherein the channel stopper region is formed by a photolithographic method that is carried out before a first photolithographic method for introducing dopants into a section of the component region outside the channel stopper region,
    wherein forming the channel stopper region comprises forming a first dopant mask on the first main surface and introducing a first dopant through a mask opening of the first dopant mask, the mask opening exposing at least one section of the sawing track region,
    wherein before introducing the first dopant, a trench is formed that extends from the first main surface into the component layer, and wherein the first dopant is introduced into the component layer through an inner surface of the trench,
    wherein the trench is formed at least partly in the sawing track region and/or the trench is filled with a doped semiconductor material of the first conductivity type.

21. A method for producing a semiconductor component, the method comprising:
    forming a channel stopper region extending from a first main surface into a component layer of a first conductivity type in an edge termination region of a component region, the edge termination region being adjacent to a sawing track region; and
    forming a doped region extending in the component region from the first main surface into the component layer,
    wherein the channel stopper region is formed by a photolithographic method that is carried out before a first photolithographic method for introducing dopants into a section of the component region outside the channel stopper region,
    wherein forming the channel stopper region comprises a high-temperature treatment at a temperature of at least 1000° C., wherein the high-temperature treatment is carried out after introducing the first dopant and before forming the doped region, wherein the first dopant is distributed over a diffusion region as a result of the high-temperature treatment, and wherein a first section of the diffusion region in the component region forms the channel stopper region.

22. The method of claim 21, wherein the high-temperature treatment is carried out at a temperature above 1000° C. and in an oxygen-containing environment, and wherein an oxide layer is formed on the first main surface.

* * * * *